US012754264B2

(12) United States Patent
Kessler

(10) Patent No.: US 12,754,264 B2
(45) Date of Patent: Oct. 6, 2026

(54) BIRDCAGE RESONATOR FOR HIGH RESOLUTION NMR APPLICATIONS

(71) Applicant: Quad Systems AG, Dietlikon (CH)

(72) Inventor: Klemens Kessler, Oberneunforn (CH)

(73) Assignee: Quad Systems AG, Dietlikon (CH)

( * ) Notice: Subject to any disclaimer, the term of this patent is extended or adjusted under 35 U.S.C. 154(b) by 303 days.

(21) Appl. No.: 18/290,050

(22) PCT Filed: May 17, 2022

(86) PCT No.: PCT/EP2022/063282

§ 371 (c)(1),
(2) Date: Nov. 9, 2023

(87) PCT Pub. No.: WO2022/243291

PCT Pub. Date: Nov. 24, 2022

(65) Prior Publication Data

US 2024/0255595 A1 Aug. 1, 2024

(30) Foreign Application Priority Data

May 20, 2021 (EP) .................................... 21174905

(51) Int. Cl.
*G01R 33/34* (2006.01)

(52) U.S. Cl.
CPC . *G01R 33/34076* (2013.01); *G01R 33/34007* (2013.01); *G01R 33/34092* (2013.01)

(58) Field of Classification Search
CPC ........ G01R 33/34007; G01R 33/34076; G01R 33/34092
See application file for complete search history.

(56) References Cited

U.S. PATENT DOCUMENTS

| | | | |
|---|---|---|---|
| 4,694,255 | A | 9/1987 | Hayes |
| 6,118,274 | A | 9/2000 | Roffmann et al. |
| 6,285,189 | B1 | 9/2001 | Wong |

(Continued)

FOREIGN PATENT DOCUMENTS

| | | | |
|---|---|---|---|
| CN | 112162224 | A | 1/2021 |
| EP | 3655790 | B1 | 5/2021 |

OTHER PUBLICATIONS

International Search Report for PCT/EP2022/063282 dated Aug. 25, 2022 (PCT/ISA/210).

(Continued)

*Primary Examiner* — Gregory H Curran
(74) *Attorney, Agent, or Firm* — Sughrue Mion, PLLC

(57) ABSTRACT

Birdcage or birdcage-derived resonator for NMR experiments irradiation and detection having two electrically conducting, circular rings at opposing axial ends, joined and fastened with a number of mutually isolated parallel electrically conducting rods distributed over the circumference. The axially outer surfaces are spaced axially by a birdcage height, and either between each of the rods and the respective ring at least one capacitor is provided or in each of the rings at least one capacitor is provided in each of the ring segments between adjacent conducting rods. The capacitors are axial capacitor bars extending between the rings and beyond their outer surfaces forming at both axial sides salient portions, and the length of the salient portions at each side is at least 25% of the birdcage height.

22 Claims, 4 Drawing Sheets

(56) References Cited

U.S. PATENT DOCUMENTS

| | | | | |
|---|---|---|---|---|
| 6,735,851 | B2 | 5/2004 | Romo et al. | |
| 8,035,384 | B2 * | 10/2011 | Saha | G01R 33/34046 324/318 |
| 11,442,125 | B2 * | 9/2022 | Yang | G01R 33/3635 |
| 2017/0299671 | A1 * | 10/2017 | Holle | G01R 33/3607 |

OTHER PUBLICATIONS

Written Opinion for PCT/EP2022/063282 dated Aug. 25, 2022 (PCT/ISA/237).

* cited by examiner

FIG. 6
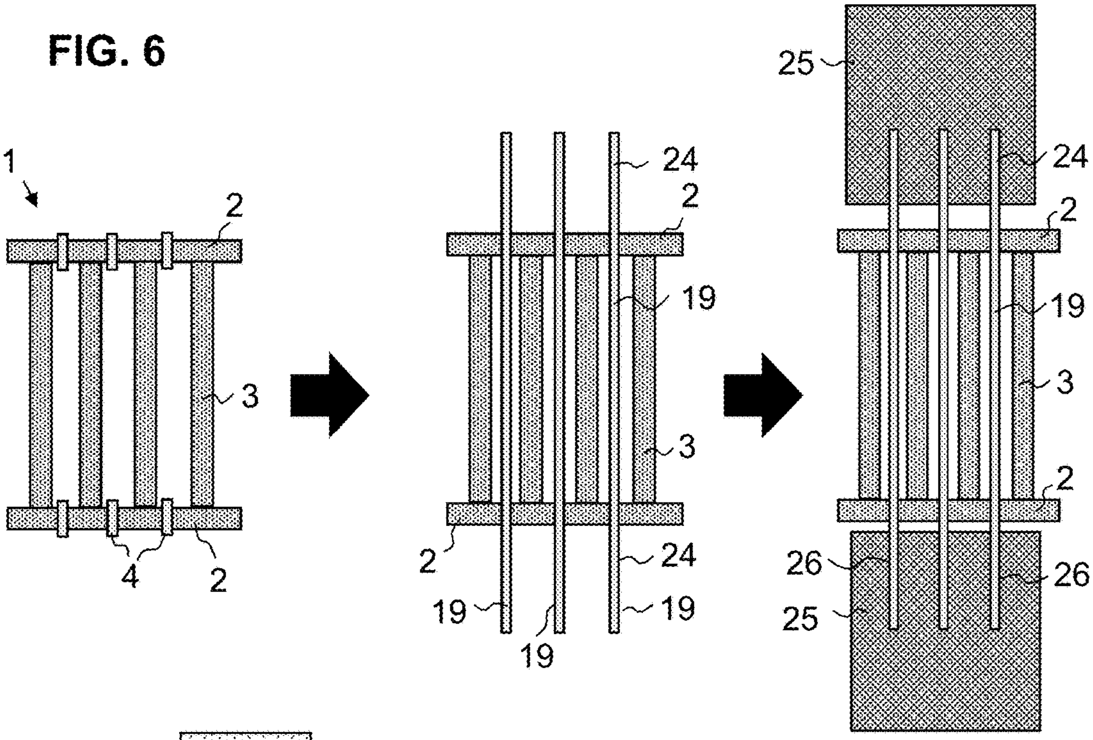
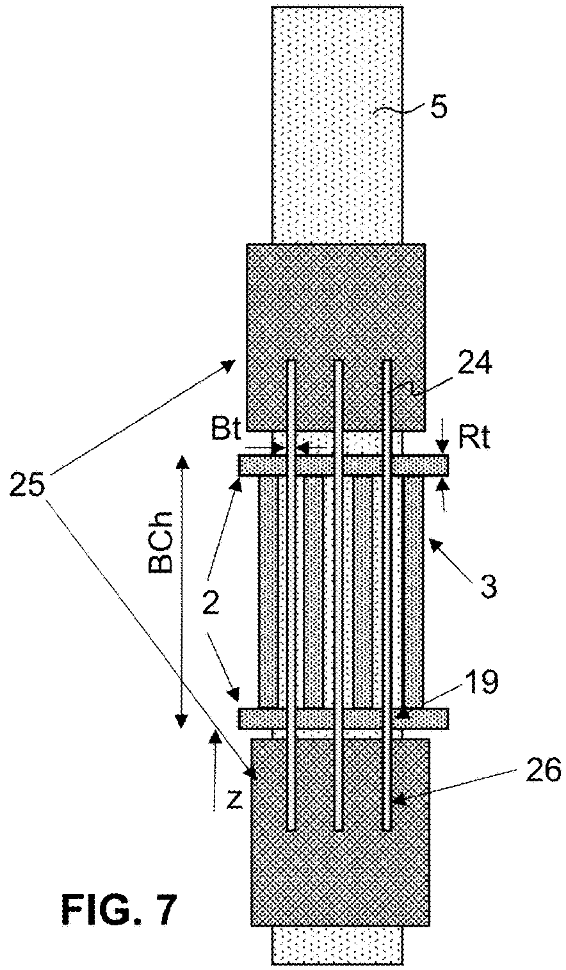
FIG. 7
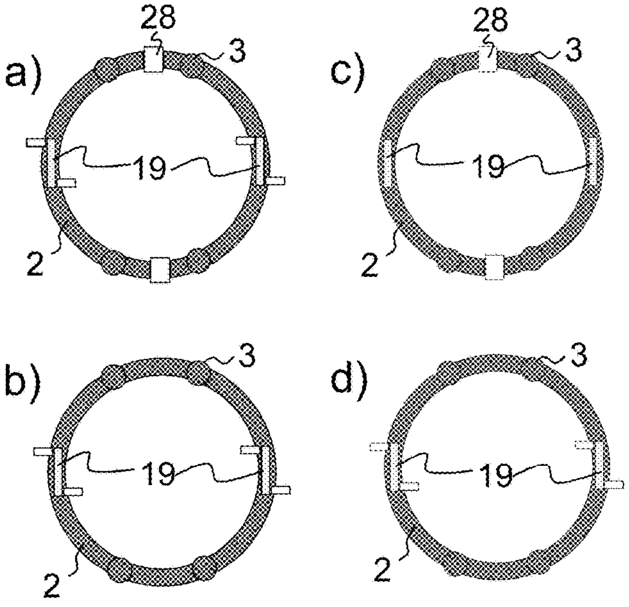
FIG. 8

BIRDCAGE RESONATOR FOR HIGH RESOLUTION NMR APPLICATIONS

CROSS REFERENCE TO RELATED APPLICATIONS

This application is a National Stage of International Application No. PCT/EP2022/063282 filed May 17, 2022, claiming priority based on European Patent Application No. 21174905.6 filed May 20, 2021.

TECHNICAL FIELD

The present invention relates to a new resonator design in particular for high-resolution NMR applications, in particular for liquid NMR spectroscopy. It furthermore relates to methods of using such a resonator design as well as to methods for making such a resonator design.

PRIOR ART

In a typical nuclear magnetic resonance experiment a static magnetic field Bo is provided in a bore of a magnet, a sample is put into the magnetic centre of this magnet, and nuclei in the sample having a nuclear spin are irradiated and subsequently or concurrently detected with a frequency corresponding to the Larmor frequency of the nuclei, the so-called magnetic resonance frequency of the nuclei in the corresponding magnetic field. Typically for the presently available static magnetic field strengths the irradiation/detection frequencies are in the range of megahertz to lower gigahertz frequencies.

For irradiation and detection highly efficient coils are used in the form of resonators the resonance frequency of which is adapted to the corresponding frequency of the nucleus to be detected in the corresponding field. The aim of these resonators is to provide an as high and as homogeneous as possible irradiation field for a given irradiation power, and to act as an as sensitive as possible receiver for detection.

For high resolution applications typically so-called saddle coils are used, the specific resonance frequency of which is tuned e.g. by additional external capacitive elements for optimisation. In particular in the field of magnetic resonance imaging also so-called birdcage resonators are used, which essentially consist of two terminal axial rings connected by a set of axial bars (typically 8 or up to 32 metal rods) which are circumferentially distributed over the circumference of the rings and which connect the two rings. If capacitors are introduced between the rings and each of the terminal ends of the bars these birdcage resonators show a low-pass behaviour, and if capacitors are introduced in the rings between adjacent bars, they show high-pass behaviour. For the case of 8 metal rods 16 capacitors are used. Also hybrid birdcage resonators are possible where there are capacitors in the ring and in the bars.

This type of birdcage resonator aggregates a lot of advantages important for high radiofrequency (RF) performance, because they show a high sensitivity, they provide a high irradiation field (B1) homogeneity, and a high efficiency.

U.S. Pat. No. 4,694,255 discloses an NMR radio-frequency coil which is made up of a plurality of conductive segments evenly spaced about the peripheries and interconnecting a pair of conductive loop elements. Each conductive segment includes at least one reactive element which may include a variable capacitive or inductive element.

U.S. Pat. No. 6,285,189 discloses a birdcage coil comprising a number of elements in birdcage geometry wherein the density of elements is such that the contribution to the total inductance from the mutual inductance of said legs exceeds 45% by conventional model calculation. To accommodate the desired density of elements, necessary capacitances are obtained from compact structures such as interdigitated patterns which may be oriented axially or between elements, or from arrangements of element portions on opposite sides of a cylindrical substrate.

U.S. Pat. No. 6,735,851 discloses a superconducting birdcage coil with low-pass and high-pass coil configurations formed by using strips each with an elongated sapphire substrate with a layer of a high temperature superconductor (HTS) material grown in a wavy pattern over its entire length on one of its main surfaces. A low-pass coil is formed with a pair of ring elements made of an electrically conductive metal and a plurality of such strips arranged parallel to one another and interconnecting these ring elements at junctions which are spaced peripherally along each of the rings. At each of the junctions, the ring element and the HTS layer form a capacitance. A high-pass coil is formed by a plurality of such strips each with electrodes of the HTS material also grown at two end positions separated from each other on the other main surface of its sapphire substrates. These strips are arranged parallel to each other and sequentially around a central axis, each lying in a plane which includes the center axis. The electrodes and the HTS layers on mutually adjacent pairs of strips are closely in face-to-face relationship so as to serve as the ring part of a birdcage configuration containing capacitors.

WO-A-2019041053 and the corresponding EP 3 655 790 disclose an NMR probe head comprising a birdcage resonator having two conductive rings and a plurality of bar-shaped connectors between them. The connectors are equipped with reactance elements, which can be tuned individually in order to compensate for asymmetries in the birdcage resonator. CN-A-112162224 relates to a high-dielectric-constant ultrahigh-field animal magnetic resonance radio frequency probe which comprises a coil unit, the coil unit comprises a cylindrical coil circuit substrate and a cylindrical inner wall substrate, and the inner wall substrate is arranged in the coil circuit substrate. The two ends of a high-dielectric-constant ceramic unit are fixed between the coil circuit substrate and the coil inner wall substrate through a ceramic unit support. All the units are independent of one another, assembling is flexible, and the sensitivity of the radio frequency probe can be effectively improved. The plurality of high-dielectric-constant ceramic blocks can greatly improve the B1 field emission efficiency in the central region, and avoids the adverse effects of coil mode increase and disorder caused by complete cylindrical barium titanate ceramic.

U.S. Pat. No. 6,118,274 proposes an NMR probehead having a generally cylindrical casing extending along a probehead axis. The NMR probehead can be inserted into the room temperature bore of an NMR spectrometer magnet providing, in a measurement region, a homogeneous static magnetic field along the probehead axis. The NMR probehead comprises a cylindrical radio frequency (RF) resonator oriented along a resonator axis and generating essentially homogeneous RF magnetic fields transverse to the resonator axis. In accordance with the invention, the angle between the probehead axis and the resonator axis is different from 0 DEG. In this manner, the inclination of the resonator does not affect the useful RF magnetic field and the signal to noise ratio of the received NMR signal is independent of the inclination angle.

SUMMARY OF THE INVENTION

While showing the above-mentioned significant advantages, birdcage resonators in the past have hardly been used in high-resolution NMR spectroscopy. One of the reasons is that prior art birdcage resonators due to the various different components required to build them show quite a significant heterogeneity of magnetic susceptibility. Compensating the magnetic susceptibility, in particular for the capacitive elements, is not easily possible. It is therefore an object of the present invention to provide for a new birdcage resonator which provides for the above-mentioned advantages of birdcage resonators in general, but which at the same time does not suffer from introducing heterogeneity of magnetic susceptibility and corresponding broadening of the linewidths detected.

In fact, to achieve the required irradiation and detection properties magnetic compensation for high resolution NMR resonators is mandatory. Compensation of metal parts is achievable, if the appropriate alloy is found. In that case, compensation can made nearly ideally. A thin, highly conductive layer (also compensated) may bring back high conductivity. RF capacitors are widely available and used but all these materials are not magnetically compensated. In contrast to metal, dielectric material is rather complex to magnetically compensate.

Unfortunately, more than one dielectric material is needed to fulfil the requirements of high res NMR, e.g. resonators can be used for a broad frequency range: 300 . . . >1200 MHz. The birdcage resonator secure on one hand excellent RF properties, but on the other hand each individual design is narrow banded (e.g. 600 MHz+/−30 MHz). This fact results in a big number of resonator designs, and for every NMR main frequency which goes up in typical 100 MHz steps, one special design is needed. Additionally, depending on application, the diameter and also the length of the resonator needs to be adapted. As a result, the capacitance of the capacitors has to vary in a huge range and ceramic materials with relative permittivity of 10 . . . >100 are needed, to shape the capacitors in a way, to reach the desired frequencies and to fit mechanically into the design.

It has been found here, that magnetic compensation can be achieved without adding additional magnetically compensating material and by stretching the axial extension along the Z axis of the dielectric material of the capacitor elements in a way, that magnetic compensation is not needed.

Magnetic compensation of the dielectric material for the capacitors entails that while shaping a dielectric material for optimal relative permittivity, mechanical stability and dielectric loss, also the magnetic susceptibility has to be optimized. This strategy is very time- and cost-consuming when realizing the dielectric material with mixtures of ceramic powders.

Using the strategy as proposed here, the optimization step of magnetic susceptibility is not necessary, so a simple and reliable approach has been found to mitigate the previous disadvantages of birdcage resonators in particular for high resolution applications, while maintaining the advantages of birdcage resonators.

According to a first aspect of the invention, it relates to a birdcage resonator for NMR experiments irradiation and detection (including birdcage-derived resonators, so where the angle is not 2pi/(no of bars)), comprising two electrically conducting, circular rings (note that the rings can be open or closed over the circumference, but are preferably closed, except for interposed capacitors e.g. for high pass resonators) at opposing axial ends, joined and fastened with a number (at least two, preferably at least four) of mutually isolated parallel electrically conducting rods (preferably equally) distributed over the circumference of said rings.

Said axially outer surfaces of said rings are spaced axially by a birdcage height.

Either (low-pass design) between each of said rods and the respective ring at least one capacitor is provided (i.e. for each rod a capacitor region at the upper ring and a capacitor region at the lower ring contact area). Preferably, in this case the at least one capacitor is provided between the respective rod and an inner circumferential surface of the ring, or between the respective rod and an outer circumferential surface of the ring, or between the respective rod and an axially facing inner surface (i.e. the surfaces of the rings which are facing each other) of the ring.

Or (high pass design) in each of the rings at least one capacitor is provided in at least two ring segments between adjacent conducting rods or in each of the ring segments between adjacent conducting rods.

The capacitors in both cases are elements separate from the parallel electrically conducting rods. They are also not forming part of the parallel electrically conducting rods or are integrated into the parallel electrically conducting rods.

Preferably the capacitors are fixed elements in the sense that they cannot be tuned in terms of capacity during assembly and/or by the end user, so they are not part of or form reactance elements which can be tuned individually and/or collectively, for example by way of electrodes movable relative to each other, e.g. in order to compensate for asymmetries in the birdcage resonator.

According to the Invention, this design is further characterised in that the dielectric material (which also provides the required capacitance with the corresponding electrodes) takes the form of axial capacitor bars or dielectric material bars extending between said rings and beyond their axial outer surfaces forming at both axial sides of said rings salient portions of said dielectric material. Further this design is characterised in that the length of said salient portions at each axial side of said rings is at least 15% or at least 20% or at least 25% of said birdcage height. Preferably all capacitors take the form of such axial capacitor bars. Such a birdcage resonator is not a tunable device, as the rings and the rods are fixedly attached to each other. So the desired degenerate resonance modes of such a resonator cannot be changed, apart from a fine tuning which however in practice takes place by way of corresponding inductances and capacitors in the wiring leading to and from such a resonator. For example: an 16-bar birdcage resonator has 16 resonances, 2 end ring resonances, and 7 resonances in degenerate pairs, and an 8-bar birdcage resonator has 8 resonances, 2 end ring resonances, and 3 resonances in degenerate pairs. For a low-pass birdcage resonator, normally the first two non-zero frequency modes are the desired ones. For a high-pass birdcage resonator the second highest frequency modes are normally the desired ones Due to the fact that the capacitors with their dielectric extension in the form of the mentioned salient portions are shaped as long axial capacitor partners, their influence on the static magnetic field is the same along the full length of these bars of dielectric material. This means that no magnetic inhomogeneity is introduced by the capacitor elements of the resonator in the relevant spatial volume for irradiation and/or detection, which also means that there is normally no need of further magnetic susceptibility matching for the presence of the capacitor elements in such a birdcage resonator.

Preferably, all the capacitor bars have the same length, as well as the same width and the same thickness. Also they typically have the same cross-sectional shape. Further they are preferably located all at the same axial position relative to the magnetic centre. They are preferably distributed regularly and/or in mirror or point symmetry over the circumference around the magnetic centre.

According to a first preferred embodiment of such a birdcage resonator, the length of said salient portions is at least 30%, preferably at least 40%, or at least 50% of said birdcage height.

Typically the birdcage height BCh is in the range of 15-35 mm, preferably in the range of 20-27 mm, and the length BI of the capacitor bars is in the range of 35-60 mm, preferably in the range of 40-50 mm, these are the values for a typical high resolution NMR setup for liquid spectroscopy using sample tube diameters of 3, 5 or 10 mm.

Each of the capacitor bars typically has a thickness Bt in the range of 0.05-1 mm, preferably in the range of 0.1-0.5 mm, and a width Bw in the range of 0.5-3 mm, preferably in the range of 1-2 mm. The thickness is typically chosen to achieve the correspondingly desired capacitance of each of the capacitors.

Preferably the cross-sectional shape of the capacitor bars is rectangular, if need be with rounded edges, but can also have another desired cross section (e.g. u-form).

Typically, each of the rings has a thickness Rt in the range of 0.5-3 mm, preferably in the range of 0.75-1.5 mm, and/or a width in the range of 0.5-3 mm, preferably in the range of 1-2 mm.

Preferably the cross-sectional shape of the rings is rectangular, however also different shapes are possible.

Preferably, each of the rings has an inner diameter Rd in the range of 1-12 mm or 2-12 mm, preferably in the range of 3-10 mm.

Preferably both rings have exactly the same dimensions.

As for the metal bars, these preferably have a circular or rectangular, preferably square cross-sectional shape with a diameter/diagonal in the range of 0.2-2 mm, preferably in the range of 0.5-1.25 mm. The bars are preferably all identical in shape, material and dimensions.

According to yet another preferred embodiment, the salient portions at both sides are at least partially embedded in a material shielding from radiofrequency, preferably in that at both ends blocks (rings) of RF shielding material are provided having receiving blind holes or radial slots into which the salient portions at least partially penetrate.

Preferably the axial height of each of these blocks is at least equal to the length of said salient portions, preferably at least 1.5 times the length, more preferably at least twice the length of said salient portions.

Said rings and/or said rods according to a preferred embodiment consist of metal or at least comprise a coating of metal, preferably of at least one of copper and silver.

Typically, said capacitor bars comprise or consist of a material having a relative permittivity in the range of 10-1000 or 10-100 and/or a dielectric loss of less than tan delta <0.001. Preferably, the capacitor bars comprise or consist of a sapphire or ceramics material, preferably selected from the group consisting aluminium oxides, zirconium oxide, titanium oxide or mixtures thereof and/or one or mixtures thereof with alkaline-earth metal oxides. The capacitor bars can also be provided with a cross-section in the form of a u to increase capacitance and the resistance to arcing.

The capacitor bars can also be provided in the form of laminates to increase the resistance to arcing. Such a laminate is preferably comprising a central polymeric layer, preferably a perhalogenated polymer, in particular selected from polyvinylfluoride (PVF), polyvinylidene fluoride (PVDF), polytetrafluoroethylene (PTFE), polychlorotrifluoroethylene (PCTFE), perfluoroalkoxy polymer (PFA), fluorinated ethylene-propylene (FEP), polyethylenetetrafluoroethylene (ETFE), polyethylenechlorotrifluoroethylene (ECTFE), perfluorinated elastomer (FFPM/FFKM), fluorocarbon [chlorotrifluoroethylenevinylidene fluoride] (FPM/FKM), fluoroelastomer [tetrafluoroethylene-Propylene] (FEPM), or chlorinated analogues or blends thereof. Such a central polymeric layer preferably has a thickness of less than 50 μm, or has a thickness in the range of 10-40 μm.

Such a laminate further comprises at least two outer ceramic layers which comprise or consist of a sapphire or ceramics material, preferably selected from the group consisting aluminium oxides, zirconium oxide, titanium oxide or mixtures thereof and/or one or mixtures thereof with alkaline-earth metal oxides or alloys thereof, wherein preferably at least one or both ceramics layers have a thickness in the range of 50-500 μm, preferably in the range of 150-350 μm.

Normally, such a resonator comprises an equal number of rods and of capacitor bars, but also designs can be realized with e.g. twice as many bars than capacitor bars. Such a resonator further normally comprises 2-12, preferably 6-10, most preferably 8 rods and/or capacitor bars.

According to yet another preferred embodiment, for a low pass birdcage resonator between each terminal end of said rods and the respective ring there is provided at least one capacitor bar, and the capacitor bars are provided on a radial inner surface of the respective ring, and the respective rod is provided on a radial inner side of the respective capacitor bar.

Preferably, capacitor bars and rods are spaced by an air gap in the majority of the area between the rings.

Between each of the capacitor bars and the corresponding radially adjacent rod and/or between each of the capacitor bars and the radial inner surface of the respective ring there can be provided an intermediate conducting or dielectric, preferably conducting layer. According to another preferred embodiment, for a high pass birdcage resonator in each of the rings at least one capacitor bar is provided in each of the ring segments between adjacent conducting rods, and said capacitor bars and said rods are, preferably equally, distributed over the circumference of the rings (e.g. in in point or mirror symmetry). Preferably there is a free interspace (air gap) between the rods and the capacitor bars. Again, between each of the capacitor bars and the corresponding ring segments there can be provided an intermediate conducting or dielectric, preferably conducting layer.

The capacitor bars preferably take the form of radially or tangentially arranged slats with e.g. rectangular cross-section with a circumferential thickness Bt in the range of 0.1-0.5 mm and a radial width Bw in the range of 1-3 mm, preferably in the range of 1.2-2.5 mm. The desired mode(s) with desired resonance frequency of such a birdcage resonator can be adapted, by way of choosing the dimensions and the material of the capacitors in particular, to be in the range of 300-1200 MHZ, preferably in the range of 600-1000 MHz. According to yet another aspect of the present invention, it relates to a nuclear magnetic resonance probe comprising a birdcage resonator as detailed above.

Also the present invention relates to the use of a birdcage resonator as detailed above for measuring a liquid sample using nuclear magnetic resonance, preferably at a static magnetic field of at least 1 Tesla, wherein the axial length (H) of the liquid in said sample is larger than the axial length (BI) of said capacitor bars, and wherein preferably the resonator has a resonance frequency in the range of 300-1200 MHZ, preferably in the range of 600-1000 MHz.

Furthermore the present invention relates to a method for making a birdcage resonator as described above.

For the case of the low-pass resonator design, preferably in this method the rings are provided, the capacitor bars are connected, preferably soldered, in an defined, preferably circumferentially distributed manner to the inner circumferential surface, and the rods are connected, preferably soldered, to the radial inner side of the respective capacitor bars, preferably in a way such that there is a free gap between each capacitor bar and the respective rod at least in the central portion between the two rings.

For the high-pass resonator design, preferably ring segments are soldered each to the terminal ends of a bar and the segments are joined by locating between adjacent segments a capacitor bar (the set of capacitor bars can first have been attached at both ends by way of the salient portions to the above-mentioned RF shielding blocks), preferably by soldering, wherein preferably between the capacitor bars and the rods at least in the central portion between the two rings there is a free gap.

Further embodiments of the invention are laid down in the dependent claims.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

FIG. 6 shows the evolution from the state-of-the-art high-pass birdcage resonator (left) to the high-pass birdcage resonator according to the invention (middle) and to the implementation with RF shielding for the salient portions of the capacitor bars (right), in each case in schematic lateral representations;

FIG. 7 shows a high-pass birdcage resonator according to the invention with RF shielding blocks for the salient portions of the capacitor bars; and FIG. 8 shows two further resonators according to the invention, in a) and b) the upper and lower ring, respectively of a first embodiment and in c) and d) the upper and lower ring, respectively, of a second embodiment.

DESCRIPTION OF PREFERRED EMBODIMENTS

Figure 1:
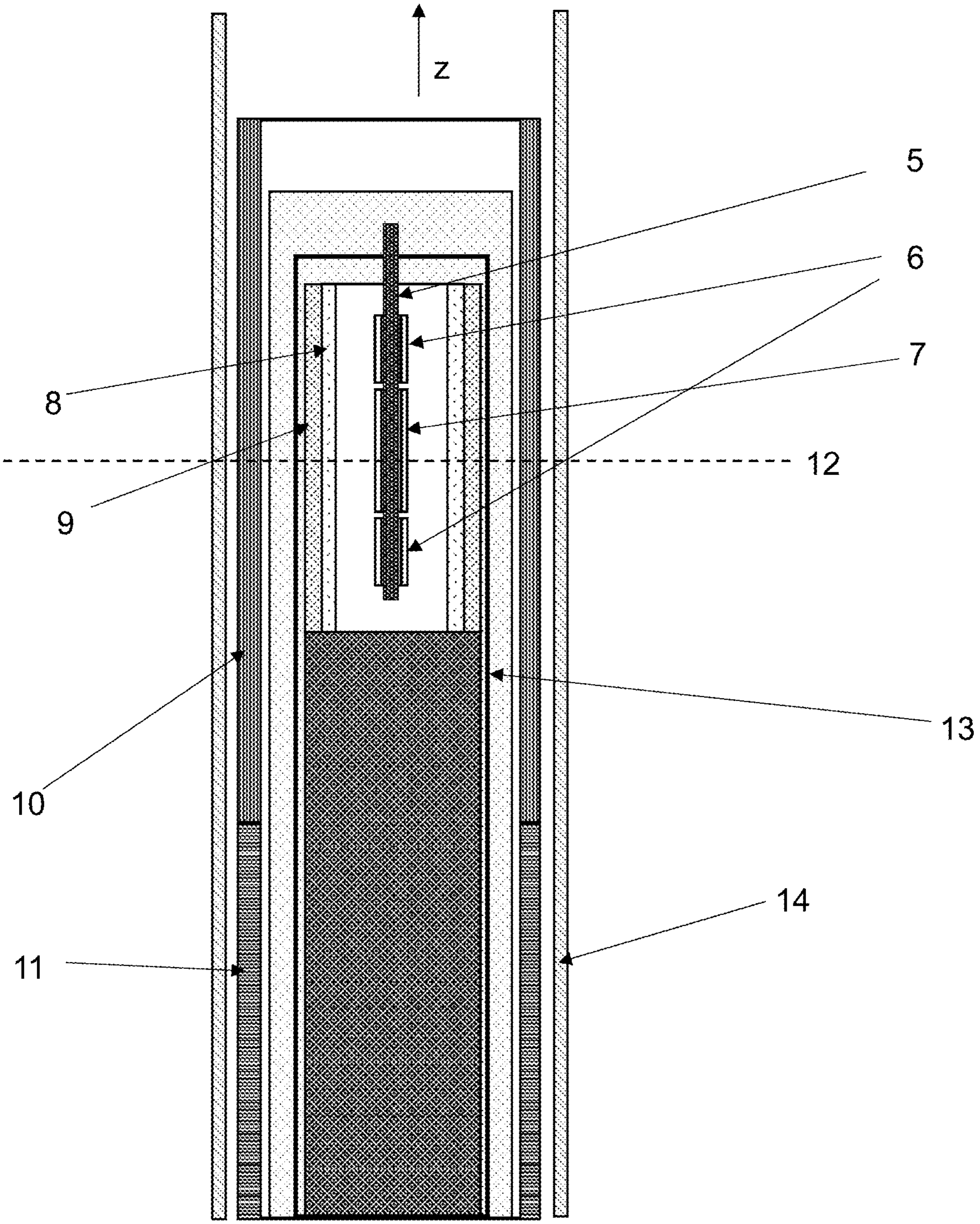
FIG. 1 shows the general RF coil setup within NMR probe.

FIG. 1 shows the typical surrounding of a resonator according to the invention in a high resolution NMR spectroscopy device, in particular for the analysis of liquid samples. A strong static magnetic field is generated by a superconducting magnet (not illustrated) which has a central vertical bore 14, in which a strong magnetic field along the axis Z is generated. In the region of the magnetic centre 12 along the Z axis, there are shim coils 10 for influencing the homogeneity of the static magnetic field, and these shim coils 10 are mounted on a shim tube 11 located in the lower part of the bore 14.

Into the central bore of that shim unit, typically from below, the actual NMR probe head, typically designated as NMR probe 13, is inserted. The NMR probe 13 in the region of the magnetic centre 12 comprises, from the radial outside to the inside, a set of gradient shield coils 9, followed by a set of gradient coils 8 for providing, if needed, temporary gradients for the measurements. The actual (liquid) NMR sample 5, normally a glass tube with a typical diameter of 3 mm, 5 mm or 10 mm (outer diameter) is inserted through the bore from above, and is located within the NMR coil 7, which above and below along the Z axis is followed by radiofrequency (RF) shields 6.

The NMR coil 7 is the actual resonator on the one hand for irradiating the sample with the radiofrequency corresponding to the Larmor frequency of the nuclei to be measured and irradiation periods of the corresponding measurement sequences, and on the other hand for receiving signal emitted from the nuclei in the detection periods of the corresponding measurement sequences. For both of these functions, but in particular for the detection period, the homogeneity of the static magnetic field is of high importance for obtaining as narrow linewidths as possible, so it is important that a corresponding coil design does not impair the homogeneity of the static magnetic field and on the other hand provides for an as controllable as possible irradiation magnetic field B1 as desired for the measurements. Typically for liquid measurements these resonators take the form of so-called saddle coils. A saddle coil system can be constructed by folding two equal rectangular coils on a cylindrical surface. The same current is carried by each coil, and the direction of the flowing current may be set in Helmholtz or anti-Helmholtz configuration. It is known that a uniform magnetic field in a given direction can be produced using the former configuration, and the second one can be used to produce linear field gradients. Also possible are helical designs or resonant cavities.

Birdcage resonators provide a different type of resonators. They are well known especially in the applications of MRI. A birdcage coil differs in essential manner from saddle coils, helices and like structures in that phase shifts between constituent current loops are employed to provide the proper current distribution. For the bird cage resonator, the phase shift is to be discretely distributed around the circumference of the coil from zero to $2\pi$. The phase shift of each element is rather frequency dependent and the birdcage resonator is tuned at a discrete frequency to achieve the desired phase shift constraint. An additional goal is to achieve a quadrature driven bird cage coil in order to maximize power efficiency upon transmission and signal-to-noise ratio during signal reception.

This type of resonator aggregates a lot of advantages important for high RF performance: High sensitivity, high B1 field homogeneity, high efficiency.

Figure 2:
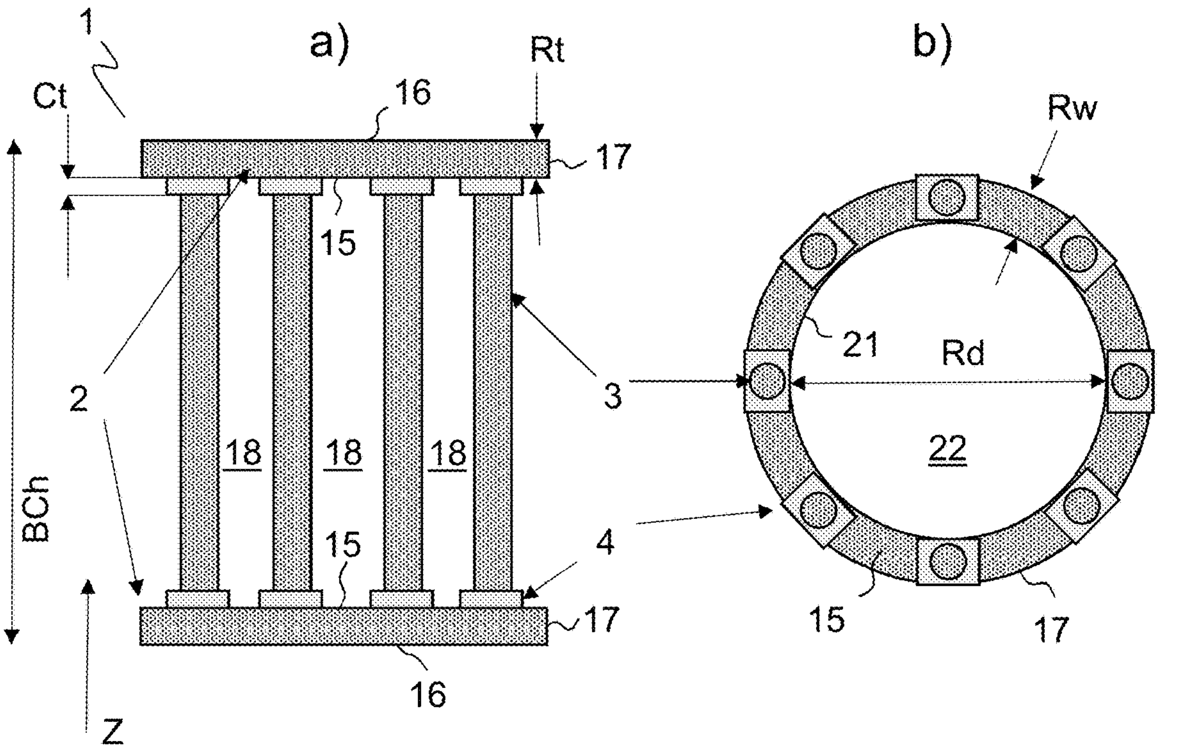
FIG. 2 shows a prior art low-pass-birdcage resonator, wherein in a) a schematic lateral view is given and in b) a view from the centre onto the inner surface of one of the rings.
Figure 3:
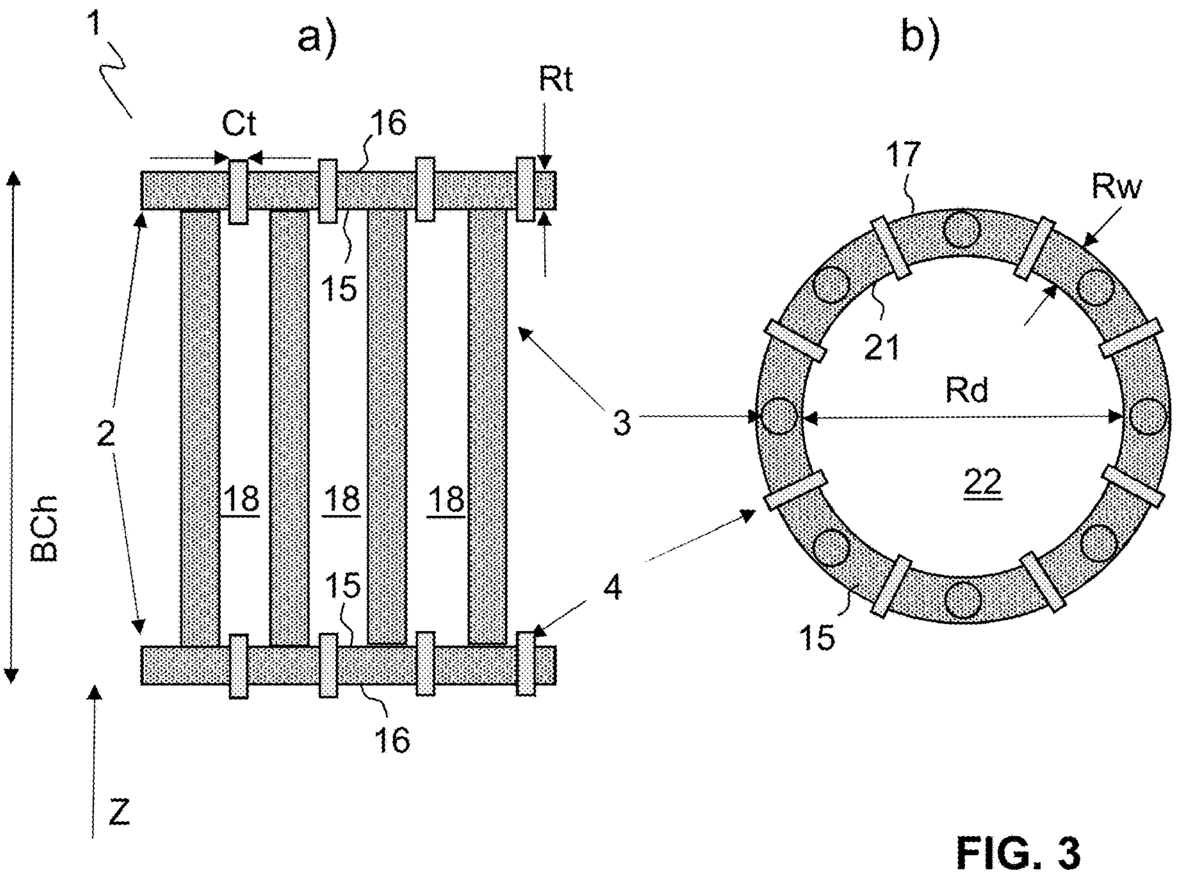
FIG. 3 shows a prior art high-pass birdcage resonator, wherein in a) a schematic lateral view is given and in b) a view from the centre onto the inner surface of one of the rings.

FIGS. 2 and 3 illustrate the two basic types of birdcage resonators, in case of FIG. 2 a low-pass resonator typically for 300-1200 MHz is shown, and in FIG. 3 a high-pass resonator for frequencies of at least 600 MHz is illustrated.

As illustrated in these figures, a birdcage resonator typically comprises two metal rings 2 offset along the Z axis symmetrically around the magnetic centre 12 of the magnet. These rings 2 are joined by an integer number, typically 8, metal rods 3 electrically connected to the rings, which are arranged parallel to the Z axis and parallel to each other.

For the case of the low-pass resonator as illustrated in FIG. 2, to form a resonator on the respective inner surfaces 15 of the rings 2 at each position where a corresponding rod 3 is located, there are provided capacitors 4 between the respective ring 2 and the respective rod 3. Electrically speaking, such a birdcage resonator is represented as a series of capacitor, inductance, capacitor for each vertical structure, and by inductances between each of these rods with capacitors.

For the case of the high-pass resonator as illustrated in FIG. 3, to form a resonator in the ring between each of the metal rods there are provided capacitors 4, so the circumference of the ring is separated into individual segments joined by capacitors. In this case electrically speaking the birdcage resonator is represented as inductances for the bars and between two bars along the ring circumference there is a sequence of an inductance and the capacitor.

Between the metal rods 3 there are interspaces 18, the axial height BCh of such a birdcage resonator is normally in the range of 20-27 mm, the inner diameter Rd of the ring is typically in the range of 5.5-10 mm, the radial width Rw of the ring is typically in the range of 1-2 mm and the axial thickness Rt of the ring is normally in the range of 0.5-2 mm, normally in the range of 1 mm. The metal rods 3 typically have a circular cross-section and a diameter in the range of 0.5-1.5 mm, typically in the range of 1 mm. The rings and the rods are made of metal.

All metal parts or preferably made of highly conductive material, optimized for 300-1200 MHz, Cu and Ag are preferred. Due to the typical skin depth of radio frequencies (300-1200 MHz), only 20 μm of the surficial metal layer is accessible for conductivity (skin effect). it is therefore important to have a large skin depth area (wire circumference*skin depth) which is sufficiently big to decrease resistivity.

Capacitor 4 is typically a low dielectric loss material with relative permittivity of e=10 . . . 1000. the capacitors are typically made of a ceramic material for low dielectric loss, high permittivity, temperature stability, and allowing for a very well-defined interface metal to ceramic via soldering.

The capacitance of the capacitors is given by the following equation $C=\varepsilon*\varepsilon_0*A/d$, wherein A is typically 1-3 $mm_2$ and d in the range of 0.1 . . . 0.5 mm for 400 . . . 800 MHZ (low pass). The capacitors 4 can also be mounted in an alternating setup (only 8 instead of 16).

As pointed out above, one of the main problems precluding widespread use of birdcage resonators is that susceptibility matching of the individual building blocks is difficult. This means that for birdcage resonators it difficult to provide for the desired magnetic field homogeneity required for narrow linewidths.

According to the present invention, to realize a birdcage resonator for high resolution NMR, one critical feature is added, namely a magnetic compensation for the ceramic parts, which is mandatory to get the required narrow lineshape (resolution).

The gist of the present invention is best illustrated by what is given in FIG. 6. As pointed out above, the key challenge for susceptibility matching in the context of birdcage resonators is the susceptibility matching of the capacitor elements 4. Susceptibility matching of these capacitor elements is difficult if not impossible. The idea of the present invention is to make sure that the capacitor elements 4 extend all along the Z axis where measurement relevant sample volume is located so that no additional susceptibility matching due to the presence of the capacitor elements is required, as these extend over the full measurement relevant stretch of the Z axis.

As a starting point, starting from the high-pass setup as illustrated in FIG. 3, see the high pass design in FIG. 6 on the left.

In a first step, according to the invention all capacitors are expanded along Z-axis in a way that they are much longer than the birdcage coil, typically equal to or longer than 40 mm (see FIG. 6 middle). This adaption eliminates the need for material compensation to achieve a homogeneous magnetic field along the Z axis. The originally 16 small capacitors 4 slicing the rings into individual segments are turned into 8 long ceramic stripes 19.

In a second optional but highly desired step, means 25 are provided in the form of RF shielding blocks to mechanically stabilize all the ceramic stripes or rather their salient portions 24 extending beyond the outer surfaces 16 of the respective rings, e.g. fixation on the top and bottom RF shield (see FIG. 6 right).

typically this step is followed by metallising pads 20 onto the surface of the ceramic stripes (on both sides) and to solder the ceramic stripes into the metal design.

The frequency of the desired mode of such a resonator can easily be changed by exchanging the dielectric material. Commercially available are low loss ceramic materials with relative permittivity between 10 and >100.

Figure 4:
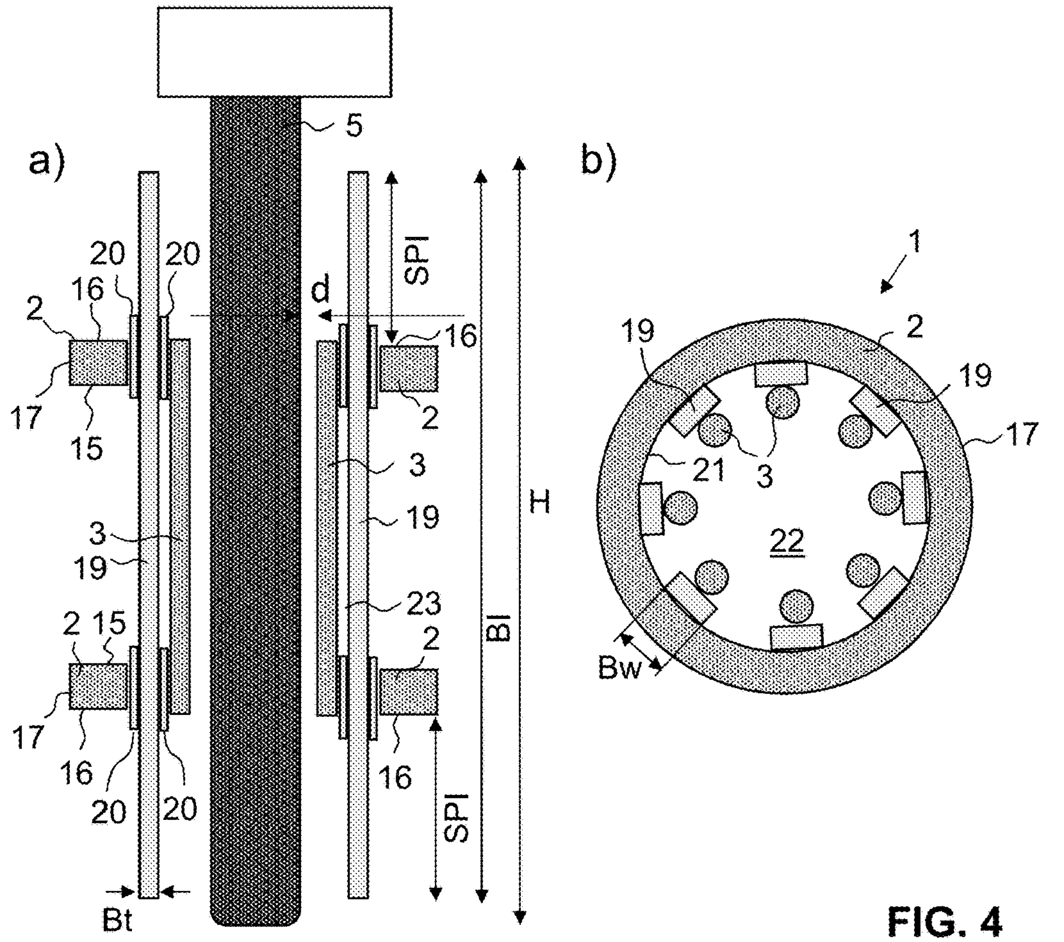
FIG. 4 shows a low pass birdcage resonator according to the invention, wherein in a) an axial cut is given and in b) a radial cut through one of the terminal rings.

How this concept is implemented in practice is illustrated for the low-pass birdcage resonator design in FIG. 4. The rings 2 are the same as described above, however in this case they are not joined to capacitors 4 via the corresponding inner surfaces 15, but by way of the radial inner surface 21 the rings 2 are connected to capacitor bars 19. On the radial inner side these capacitor bars 19 are followed by a metal rod 3, which is longer than the metal rod in the conventional design according to FIG. 2 by twice the thickness Rt of the rings. Like that the rods 3 are located as close as possible to the sample for irradiation and detection leading to high power input and high-sensitivity. The axial length BI of the capacitor bars 19 is equal to approximately the height H of the liquid in the sample tube. There is only a small gap d between the outer surface of the sample tube and the bars 3, and preferably there is a gap 23 of air between the rods 3 and the respective associated capacitor bar 19. The capacitor bars 19 have a thickness Bt in the same range as given above for the conventional capacitor design, and they are made of a ceramic material. The width Bw of the capacitor bars is as detailed above. The capacitor bars 19 can also be a layered structure, in particular in order to avoid arcing. This can be achieved by having a sandwich structure with outer layers of ceramic or another dielectric material, and a central layer of plastic material, preferably PTA or PTFE, having much higher arcing voltages in the range of around 50,000 V than typical ceramic dielectric materials, where the arcing voltage at the frequencies of concern for the applications here is in the range of around 10,000 V. In such a setup, the thickness of the plastic layer is typically below 50 μm, and the thickness of the outer ceramic dielectric layers is adapted for the corresponding desired capacitance, typically it is in the range of about 250 μm.

For attaching the capacitor bars 19 on both sides there are provided intermediate layer patches 20, which can be metal pads or simply a layer of soldering material. The dimensions and the materials for the rings, the bars and for the capacitors can be chosen as given above for the conventional designs.

Figure 5:
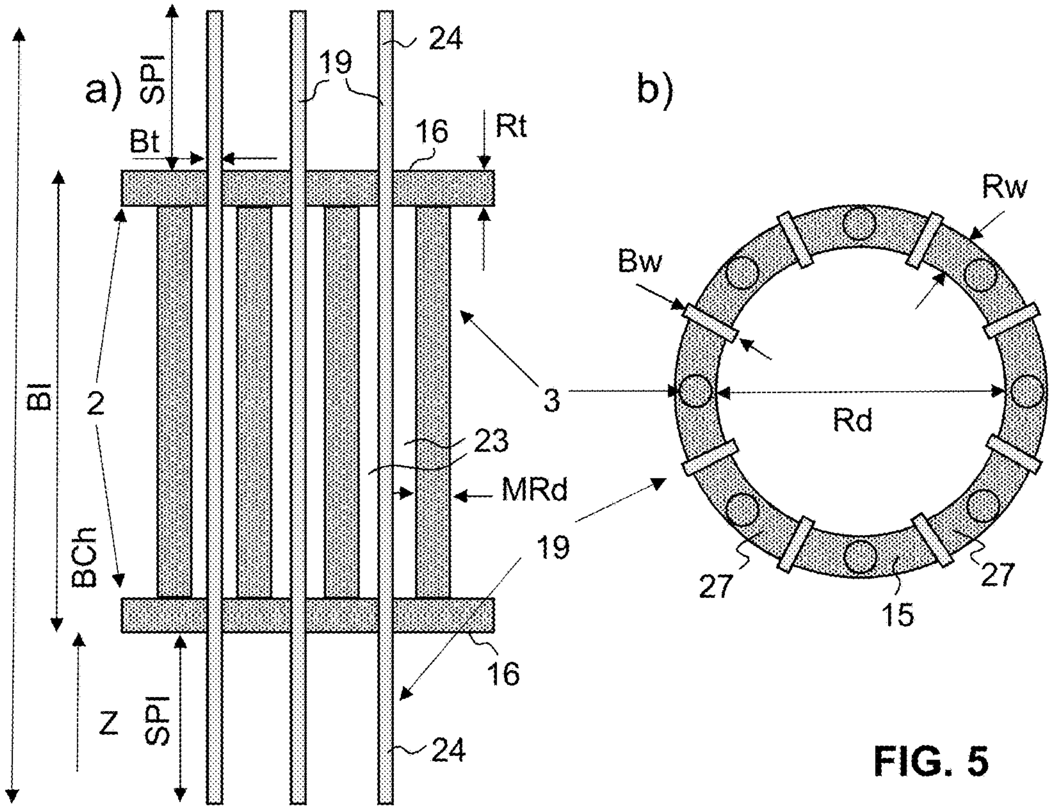
FIG. 5 shows a high-pass birdcage resonator according to the invention, wherein in a) a schematic lateral view is given and in b) a view from the centre onto the inner surface of one of the rings.

How the concept is implemented in practice for the high-pass birdcage resonator design is illustrated in FIG. 5. In this case the capacitor bars 19 are located between segments 27 of the respective rings 2. They extend beyond the outer surfaces 16 of the corresponding rings in the form of salient portions 24. As pointed out above, and this applies also to the low-pass birdcage resonator design, the salient portions are held in RF shielding blocks 25 (see description and illustration in FIG. 7 further below). The dimensions of the capacitor bars 19 are the same as for the low-pass resonator as detailed above. The capacitor bars 19 in this case are oriented radially with their long axis in a cross-sectional view, and they intersect the corresponding ring at regular intervals.

As pointed out above, for stability but also for shielding purposes, the salient portions 24 of the capacitor bars 19 are held in RF shielding blocks 25, as is illustrated in FIG. 7 for the high-pass birdcage resonator design. These RF shielding blocks 25 take the form of rings which are provided with a series of receiving blind holes 26 or slots (for the case where the radial width of the shielding block ring 25 is approximately the same as the width Bw of the capacitor bars 19).

As mentioned above, also different designs of the birdcage resonator are possible. In FIG. 8 two additional embodiments for high pass resonators are shown. In a) and b) schematically the upper and lower ring, respectively, of the first embodiment are shown. In this embodiment the upper and the lower ring are interrupted by capacitor bars 19, while in this case the capacitor bars are not oriented radially but tangentially. Also these capacitor bars 19 comprise salient portions 24 extending beyond the upper and lower surface of the resonator. In this case in the upper ring additionally two gaps are provided.

It is also possible that, and this is illustrated in c) and d), where schematically the upper and lower ring, respectively, of the second embodiment are shown, the capacitor bars 19 are only interrupting the conductivity of the lower ring. Also these capacitor bars 19 comprise salient portions 24 extending beyond the upper and lower surface of the resonator. In this case in the upper ring additionally two gaps are provided.

LIST OF REFERENCE SIGNS

| | |
|---|---|
| 1 | birdcage resonator |
| 2 | metal ring |
| 3 | metal rod |
| 4 | capacitor |
| 5 | NMR sample |
| 6 | RF shields |
| 7 | NMR coil, resonator |
| 8 | gradient coil |
| 9 | gradient shield coil |
| 10 | shim coils |
| 11 | shim tube |
| 12 | magnetic centre |
| 13 | NMR probe |
| 14 | warm magnet bore |
| 15 | an axially facing inner surface, inner surface of 2 |
| 16 | outer surface of 2 |
| 17 | outer circumferential surface, radial outer surface of 2 |
| 18 | interspace between 3 |
| 19 | capacitor bar |
| 20 | intermediate layer between 3 and 19, metal pads |
| 21 | inner circumferential surface, radial inner surface of 2 |
| 22 | inner space of 1 |
| 23 | gap between 3 and 19 |
| 24 | salient portion of 19 projecting beyond 16 |

-continued

LIST OF REFERENCE SIGNS

| | |
|---|---|
| 25 | RF shielding block |
| 26 | receiving blind hole in 25 |
| 27 | ring segment |
| 28 | gap in ring |
| Bl | axial length of 19 |
| Bt | thickness of 19 |
| Bw | width of 19 |
| BCh | birdcage height |
| Ct | capacitor thickness |
| d | gap between sample and coil |
| H | height of liquid in NMR sample |
| MRd | metal rod diameter |
| Rd | ring inner diameter |
| Rt | ring thickness |
| Rw | ring width |
| SPl | salient portion length |
| Z | Z-Axis |

The invention claimed is:

1. A birdcage resonator for NMR experiments irradiation and detection comprising two electrically conducting, circular rings at opposing axial ends, joined and fastened with at least two mutually isolated parallel electrically conducting rods distributed over the circumference of said rings, wherein said axially outer surfaces of said rings are spaced axially by a birdcage height, wherein between each of said rods and the respective ring, at least one axial capacitor bar is provided, wherein said at least one axial capacitor bar has a rectangular or square cross-sectional shape with a thickness in a range of 0.05-1 mm and a width in a range of 0.5-3 mm, wherein said axial capacitor bars between at least two electrodes provide a respective capacitance, and wherein said capacitor bars extend between said rings and beyond outer surfaces of said rings forming, at both axial sides of the rings, salient portions, and wherein a length of said salient portions at each axial side is at least 15% of said birdcage height.

2. The birdcage resonator according to claim 1, wherein the length of said salient portions is at least 20%, 25% or 30%, or at least 40%, or at least 50% of said birdcage height, or wherein the birdcage height is in the range of 15-35 mm, or in the range of 20-27 mm, and the length of the capacitor bars is in the range of 35-60 mm, or in the range of 40-50 mm.

3. The birdcage resonator according to claim 1, wherein each of the capacitor bars has a thickness in the range of 0.1-0.5 mm, and a width in the range of 1-2 mm;

or wherein each of the rings has a thickness in the range of 0.5-3 mm, or in the range of 0.75-1.5 mm, and a width in the range of 0.5-3 mm, or in the range of 1-2 mm, or wherein each of the rings has an inner diameter in the range of 2-12 mm, or in the range of 3-10 mm, or wherein at least one or each of the bars has a cross-sectional shape with a diagonal in the range of 0.2-2 mm, or in the range of 0.5-1.25 mm.

4. The birdcage resonator according to claim 1, wherein the salient portions at both sides are at least partially embedded in a material shielding from radiofrequency.

5. The birdcage resonator according to claim 1, wherein said rings and said rods consist of metal or at least comprise a coating of metal, or wherein said capacitor bars comprise or consist of a material having a relative permittivity in the range of 10-1000 or 10-100 and/or a dielectric loss of less than tan delta <0.001, or wherein said capacitor bars comprise or consist of a sapphire or ceramics material, or wherein in each of the rings at least one capacitor is provided in at least two or each of the ring segments between adjacent conducting rods.

6. The birdcage resonator according to claim 1, wherein the capacitor bars are provided in the form of laminates, comprising a central polymeric layer, and comprising at least two outer ceramic layers which comprise or consist of a sapphire or ceramics material.

7. The birdcage resonator according to claim 1, wherein the birdcage resonator is shaped in the form of a low pass resonator, where the capacitors and metal bars are distributed in point or mirror symmetry in the xy plane defined by the rings, and/or wherein it comprises an equal number of rods and of capacitor bars.

8. The birdcage resonator according to claim 1, wherein it comprises 2-12, or 6-10, or 8 rods and/or capacitor bars.

9. The birdcage resonator according to claim 1, wherein between each terminal end of said rods and the respective ring at least one capacitor bar is provided, and wherein the capacitor bars are provided on a radial inner surface of the respective ring, and the respective rod is provided on a radial inner side of the respective capacitor bar, or wherein between each of the capacitor bars and the corresponding radially adjacent rod and/or between each of the capacitor bars and the radial inner surface of the respective ring there is provided an intermediate conducting layer, forming the electrodes.

10. The birdcage resonator according to claim 1, comprising a resonance frequency in the range of 300-1200 MHz, or in the range of 600-1000 MHz.

11. A nuclear magnetic resonance probe comprising a birdcage resonator according to claim 1.

12. A method of using a birdcage resonator according to claim 1 for measuring a liquid sample using nuclear magnetic resonance, at a static magnetic field of at least 1 Tesla, wherein the axial length of the liquid in said sample is larger than the axial length of said capacitor bars, and wherein the resonator has a resonance frequency in the range of 300-1200 MHz, or in the range of 600-1000 MHz.

13. A method for making a birdcage resonator according to claim 1, wherein the rings are provided, the capacitor bars are connected, including soldered, in an equally circumferentially distributed manner to an inner circumferential surface, and the rods are connected, including soldered, to a radial inner side of the respective capacitor bars, in a way such that there is a free gap between each capacitor bar and the respective rod at least in the central portion between the two rings.

14. The birdcage resonator according to claim 1, wherein each of the capacitor bars has a cross-sectional shape which is rectangular or u-shaped;

or wherein each of the rings has a cross-sectional shape which is rectangular.

15. The birdcage resonator according to claim 1, wherein the salient portions at both sides are at least partially embedded in a material shielding from radiofrequency, in that at both ends blocks of RF shielding material are provided having receiving blind holes into which the salient portions at least partially penetrate, wherein the axial height of each of these blocks is at least equal to the length of said salient portions, or at least 1.5 times the length, or at least twice the length of said salient portions.

16. The birdcage resonator according to claim 1, wherein said rings and said rods consist of metal or at least comprise a coating of copper or silver, or wherein said capacitor bars comprise or consist of a sapphire or ceramics material, selected from the group consisting of aluminium oxides, zirconium oxide, titanium oxide or mixtures thereof and/or one or mixtures thereof with alkaline-earth metal oxides.

17. The birdcage resonator according to claim 1, wherein the capacitor bars are provided in the form of laminates, comprising a central polymeric layer, based on a perhalogenated polymer, including those selected from polyvinylfluoride (PVF), polyvinylidene fluoride (PVDF), polytetrafluoroethylene (PTFE), polychlorotrifluoroethylene (PCTFE), perfluoroalkoxy polymer (PFA), fluorinated ethylene-propylene (FEP), polyethylenetetrafluoroethylene (ETFE), polyethylenechlorotrifluoroethylene (ECTFE), perfluorinated elastomer (FFPM/FFKM), fluorocarbon [chlorotrifluoroethylenevinylidene fluoride] (FPM/FKM), fluoroelastomer [tetrafluoroethylene-Propylene] (FEPM), or chlorinated analogues or blends thereof, having a thickness of less than 50 μm, or having a thickness in the range of 10-40 μm, and comprising at least two outer ceramic layers which comprise or consist of a sapphire or ceramics material, selected from the group consisting aluminium oxides, zirconium oxide, titanium oxide or mixtures thereof and/or one or mixtures thereof with alkaline-earth metal oxides, wherein at least one or both ceramics layers have a thickness in the range of 50-500 Micron, or in the range of 150-350 Micron.

18. The birdcage resonator according to claim 1, wherein in each of the rings at least one capacitor bar is provided in at least two or in each of the ring segments between adjacent conducting rods, and wherein said capacitor bars and said rods are equally distributed over the circumference of the rings, wherein there is a free interspace between the rods and the capacitor bars.

19. A birdcage resonator for NMR experiments irradiation and detection comprising two electrically conducting, circular rings at opposing axial ends, joined and fastened with at least two mutually isolated parallel electrically conducting rods distributed over the circumference of said rings, wherein said axially outer surfaces of said rings are spaced axially by a birdcage height, wherein between each of said rods and the respective ring, at least one axial capacitor bar is provided, wherein the capacitors take the form of axial capacitor bars, which between at least two electrodes provide a respective capacitance, said axial capacitor bars extending between said rings and beyond outer surfaces of said rings forming, at both axial sides of the rings, salient portions, wherein a length of said salient portions at each axial side is at least 15% of said birdcage height, and wherein in each of the rings at least one capacitor bar is provided in at least two or in each of the ring segments between adjacent conducting rods.

20. The birdcage resonator according to claim 19, wherein the capacitor bars take the form of radially or tangentially arranged slats with rectangular cross-section with a circumferential thickness in the range of 0.1-0.5 mm and a radial width in the range of 1-3 mm, or in the range of 1.2-2.5 mm.

21. A method of using a birdcage resonator according to claim 19 for measuring a liquid sample using nuclear magnetic resonance, at a static magnetic field of at least 1 Tesla, wherein the axial length of the liquid in said sample is larger than the axial length of said capacitor bars, and wherein the resonator has a resonance frequency in the range of 300-1200 MHz, or in the range of 600-1000 MHz.

22. A method for making a birdcage resonator according to claim 19, wherein ring segments are soldered each to the terminal ends of a rod and the segments are joined by locating between adjacent segments a capacitor bar, including by soldering, wherein between the capacitor bars and the rods at least in the central portion between the two rings there is a free gap.

* * * * *